(12) United States Patent
Wang et al.

(10) Patent No.: US 8,067,940 B2
(45) Date of Patent: Nov. 29, 2011

(54) TUBULAR MAGNETIC RESONANCE SURFACE COIL, AND METHOD AND SYSTEM FOR PROCESSING SIGNALS THEREFROM

(75) Inventors: Hai Ning Wang, ShenZhen (CN); Jian Min Wang, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 271 days.

(21) Appl. No.: 12/436,969

(22) Filed: May 7, 2009

(65) Prior Publication Data

US 2010/0283462 A1    Nov. 11, 2010

(51) Int. Cl.
    *G01V 3/00*    (2006.01)
(52) U.S. Cl. .................................. 324/318; 324/322
(58) Field of Classification Search .............. 324/318, 324/322
    See application file for complete search history.

(56) References Cited

U.S. PATENT DOCUMENTS

| | | | | |
|---|---|---|---|---|
| 6,097,186 | A * | 8/2000 | Nabetani | 324/319 |
| 7,109,710 | B2 * | 9/2006 | Chu et al. | 324/309 |
| 7,446,529 | B2 * | 11/2008 | Okamoto | 324/318 |
| 7,884,608 | B2 * | 2/2011 | Okamoto | 324/318 |

* cited by examiner

*Primary Examiner* — Louis Arana
(74) *Attorney, Agent, or Firm* — Schiff Hardin LLP

(57) ABSTRACT

In a method and system for processing radio frequency signals of a tubular surface coil, the N channels of coil output signals are generated based on M channels of radio frequency signals acquired by M coil units in the tubular surface coil, wherein N is an even number greater than 1 and is less than or equal to M, and the N channels of coil output signals can be divided into N/2 pairs, with the two channels of coil output signals in each of the pairs respectively coming from the coil units located at symmetrical positions of the tubular surface coil. The respective modulus values of the two channels of coil output signals in said each pair of coil output signals are multiplied to obtain N/2 products which are then summed, and the square root of the summed result is computed, so as to generate a lateral cross-sectional image according to the computed result of square root. The signal strength in an imaging area and the uniformity of signal to noise ratio are thereby improved.

10 Claims, 5 Drawing Sheets

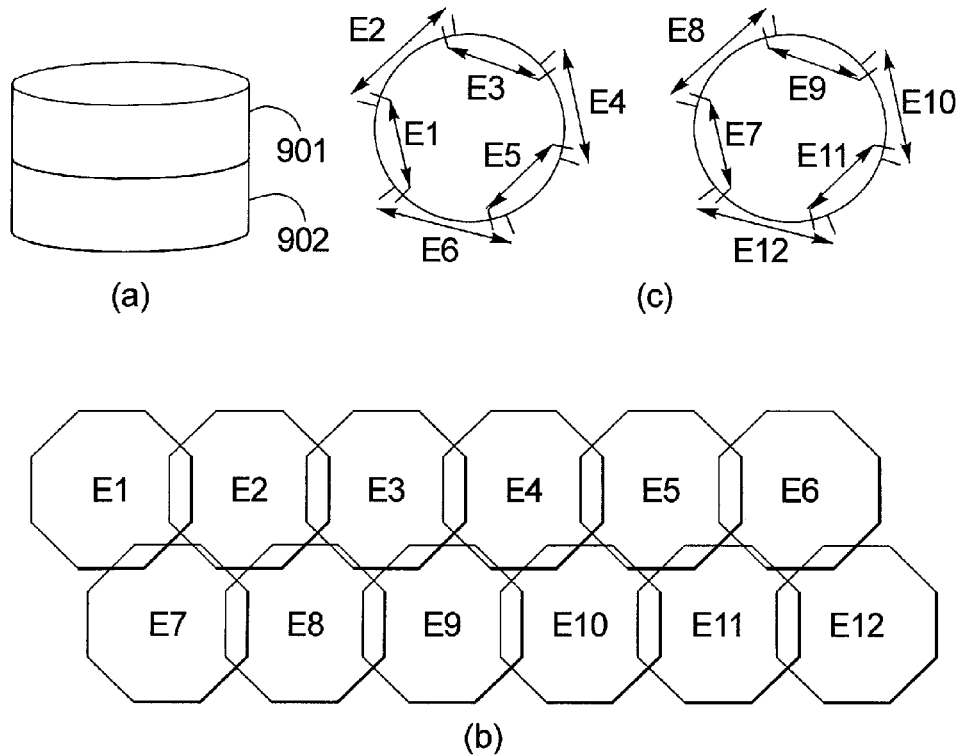
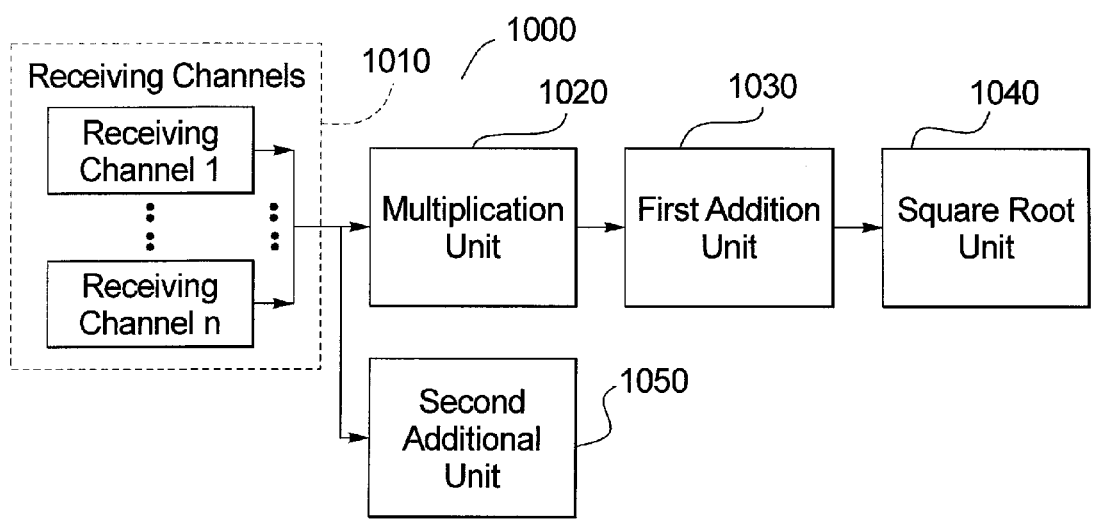
*FIG. 9*
*FIG. 10*

US 8,067,940 B2

TUBULAR MAGNETIC RESONANCE SURFACE COIL, AND METHOD AND SYSTEM FOR PROCESSING SIGNALS THEREFROM

BACKGROUND OF THE INVENTION

1. Field of the Invention

The present invention relates to the magnetic resonance imaging (MRI) technology, and particularly to a tubular surface coil and a method and system for processing radio frequency (RF) signals of such a tubular surface coil.

2. Description of the Prior Art

The basic principle of MRI is that hydrogen atoms (or other atoms, but hydrogen atoms are most commonly used) in human tissues will be directionally aligned under the effects of a fixed magnetic field. When an external radio frequency pulse is applied, these hydrogen atoms will be deviated due to the effects of the radio frequency pulses. After the radio frequency pulses vanishes, these hydrogen atoms will recover to the original state. During the recovering process, sampling radio frequency signals generated by these hydrogen atoms and then reconstructing an image using the acquired signals can result in an image of the human tissues. Since the distribution of hydrogen atoms in different tissues varies, different human tissues can be distinguished through the obtained images.

In MRI equipment, a coil is a device for acquiring such signals, the basic principle being similar to that of a radial field receiving antenna. According to the relationship with respect to a human body, such coils can be divided into body coils, and surface coils, etc., and according to the shape, the coils can be divided into: tubular coils, planar coils, helmet-shaped coils, fan-shaped coils, etc. A knee coil is a tubular surface coil, and by taking the knee coil as an example hereinbelow, the structure and imaging features of conventional tubular surface coils will be explained.

FIG. 1 shows a diagram of the construction structure of an existing knee coil. Referring to FIG. 1, wherein:

part (a) is the appearance of a conventional knee coil, which is tubular;

part (b) is a schematic diagram of the exploded structure of the existing knee joint coil; according to the exploded schematic diagram, the construction units of the coil are coil units, and in FIG. 1, the number of coil units is six as an example, and E1 to E6 represent the coil units; and part (c) is a diagram of positional relationship between the coil units when the six coil units are arranged into a tubular shape.

During the operation of the MRI equipment, each coil unit acquires corresponding radio frequency signals, and the acquired radio frequency signals are vectors and are sent to a system for processing radio frequency signals in the MRI equipment, therefore, these signals sent by the coil to the system for processing radio frequency signals are referred to as coil output signals. The system for processing radio frequency signals is used for performing radio frequency signals processing of the coil output signals which are then sent to an image reconstruction system to reconstruct an image, and FIG. 2 shows a schematic diagram of an existing system 200 for processing radio frequency signals. Referring to FIG. 2, the existing system 200 for processing radio frequency signals comprises: N receiving channels 210 and a radio frequency signal processing module 220.

The N receiving channels 210 are used for receiving N channels of the coil output signals coming from the coil, and sending the N channels of coil output signals to the radio frequency signal processing module 220. N is an integer greater than 1 and less than or equal to the number of coil units in the coil (the number of coil units in the coil is set as M below, with M being an integer greater than 1). If the number N of receiving channels is equal to the number M of coil units in the coil, M channels of radio frequency signals can be taken directly as the coil output signals, and sent to the corresponding N receiving channels, and if the number N of receiving channels is less than the number M of coil units in the coil, N channels of coil output signals can be generated after certain signal synthesizing of M channels of radio frequency signals, and sent to the corresponding N receiving channels.

The radio frequency signal processing module 220 is used for performing radio frequency signal processing on the received coil output signals. In the prior art, said radio frequency signal processing is as follows: summing the square of the modulus values of each of the received channel of coil output signals, and computing the square root of the obtained sum. The result of the square root computation can be used in performing image reconstruction. Taking the coil shown in FIG. 1 as an example, assuming that the number N of receiving channels is equal to the number M of the coil units in the coil, then said radio frequency signal processing is as follows: calculating square $(S01^2+S02^2+ \ldots +S06^2)$, wherein "square" represents the square root computation, and where $S01, S02, \ldots, S06$ represent the radio frequency signals from coil units $E1, E2 \ldots E6$, respectively.

The image reconstruction will obtain three types of basic images: lateral cross-sectional plane images, sagittal plane images and coronal plane images, and the images in other sections can also be obtained by performing a certain transformation on said three types of basic images.

The signal strength acquired by the coil units in the surface coil at a close distance is much greater than that acquired at a farther distance. This results, in the images obtained according to the abovementioned method, in both the signal strength between different areas (for example, the surface area and central area of the tubular surface coil) and the signal to noise ratio (SNR) proportional to the signal strength are significantly different, that is, the signal strength and the uniformity of signal to noise ratio within an imaging area are relatively poor.

FIG. 3 and FIG. 4 are computer screenshots, respectively showing diagrams of the distribution of signal to noise ratio of the lateral cross-sectional images and the sagittal plane image of an existing knee coil. Since the distribution of signal to noise ratio of the coronal plane images has the same features as that of the sagittal plane images, a diagram of the signal to noise ratio distribution of the coronal plane image is not shown in this application document. In FIGS. 3 and 4, the signal to noise ratio inside tissues and on the surface of tissues are illustrated in the form of contour lines, and the higher density of curves represents the greater difference. It can be seen from FIGS. 3 and 4 that, in the lateral cross-sectional images and the sagittal section images obtained by using the existing technology, the signal strength on the tissue surface is much greater than that inside the tissue, and accordingly, the signal to noise ratio on the tissue surface of is also much greater than that inside the tissues. In general, both the signal strength and the uniformity of the signal to noise ratio within the imaging area are relatively poor.

SUMMARY OF THE INVENTION

An object of the present invention is to provide a method for processing radio frequency signals of a tubular surface coil, a system for processing radio frequency signals of the tubular surface coil, and a tubular surface coil, with which the signal strength and uniformity of the signal to noise ratio are improved within the imaging area of the lateral cross-sectional image.

This object is achieved in accordance with the present invention.

By a method for processing radio frequency signals of a tubular surface coil, wherein the tubular surface coil has M coil units, M being an even number greater than 1, and the M coil units are divided into M/2 pairs, with two coil units in each of the pairs being disposed at symmetrical positions in said tubular surface coil. The method includes the steps of generating N channels of coil output signals based on M channels of radio frequency signals, acquired by the M coil units, wherein N is an even number greater than 1 and less than or equal to M, and the N channels of coil output signals can be divided into N/2 pairs, with the two channels of coil output signals in each of the pairs respectively coming from the coil units at the symmetrical positions in said tubular surface coil, and multiplying respectively the modulus values of the two channels of coil output signals in each pair of coil output signals to obtain N/2 products which are then summed, and computing the square root of the summed result, with the computed result of square root being used to generate a lateral cross-sectional image.

The method can further include summing the modulus values of the N channels of coil output signals, and the summed result being used to generate a sagittal plane image and/or a coronal plane image.

When N is equal to M, the step of generating N channels of coil output signals includes taking radio frequency signals acquired by each of the coil units as one channel of the coil output signals.

In one embodiment, when N is less than M, the step of generating N channels of coil output signals includes dividing all or a part of the M coil units into N groups, wherein there are at least two groups which comprise one coil unit, and there are at least two groups which contain more than one coil units, and dividing the N groups into N/2 pairs, with the two groups of the coil units in each of the pairs being located at the symmetrical positions of the tubular surface coil. For the group having only one coil unit, radio frequency signals acquired by the coil unit in the group are used as one channel of the coil output signals, and for the group having more than one coil units, the radio frequency signals acquired by all the coil units in the group are synthesized into one channel of the coil output signals.

In another embodiment, when N is less than M, the step of generating N channels of coil output signals includes dividing a part of the M coil units into N groups, with each group having one coil unit, and dividing the N groups into N/2 pairs, with the two groups of the coil units in each of the pairs being located at the symmetrical positions of said tubular surface coil. The radio frequency signals acquired by each of the groups of coil unit are used as one channel of the coil output signals.

In another embodiment, when N is less than M, the step of generating N channels of coil output signals includes dividing all or a part of the M coil units into N groups, with each group having more than one coil units, and dividing the N groups into N/2 pairs, with the two groups of the coil units in each of the pairs being located at the symmetrical positions of the tubular surface coil. The radio frequency signals acquired by all the coil units in each of the groups are synchronized into one channel of the coil output signals.

The invention also encompasses a system for processing radio frequency signals in a tubular surface coil, wherein the tubular surface coil comprises M coil units, and M is an even number greater than 1, and the M coil units can be divided to M/2 pairs, with the two coil units in each of the pair being located at symmetrical positions of the tubular surface coil. The system for processing radio frequency signals has N receiving channels, wherein N is an even number greater than 1 and less than or equal to M, and the system for processing radio frequency signals receives N channels of coil output signals from the tubular surface coil via the N receiving channels. The N channels of the coil output signals can be divided into N/2 pairs, with the two channels of coil output signals in each of the pairs respectively coming from the coil units located at the symmetrical positions of said tubular surface coil.

A multiplication unit multiplies the modulus values of the two channels of coil output signals in each of the channel pairs of output signals respectively, to obtain N/2 products/

A first addition unit sums the N/2 products, to obtain a summed result.

A square root computation unit computes the square root of said summed result, said computed result of square root being used to generate a lateral cross-sectional image.

The system for processing radio frequency signals can further have a second addition unit, for summing the modulus values of the N channels of coil output signals, with the summed result being used to generate a sagittal plane image and/or a coronal plane image.

The invention also encompasses tubular surface coil, having M coil units, wherein M is an even number greater than 1, and the M coil units can be divided into M/2 pairs, with the two coil units in each of the pairs being located at symmetrical positions of the surface coil. The tubular surface coil further has a memory module that stores N coil output signals, and the grouping relationship when a part or all of said M coil units are divided into N groups, wherein N is an even number greater than 1 and less than or equal to M, and the N groups can be divided into N/2 pairs, with the two groups of coil units in each of the pairs being located at the symmetrical positions of said tubular surface coil.

A signal generating module that, according to the grouping relationship, takes the radio frequency signals acquired by a group that has only one coil unit as one channel of the coil output signals, and/or synthesizes the radio frequency signals acquired by a group that has more than one coil units, into one channel of the coil output signals.

The M coil units constitute a number of tubular components, and each of the tubular components has a number of coil units. The multiple tubular components have a coincident axis, and they are adjacent one another in succession in the direction of the axis, and the adjacent tubular components stagger half a coil unit in the tangential direction of the circumference in a lateral cross-sectional plane.

In accordance with the invention, during the course of processing radio frequency signals of the tubular surface coil, the sum of square of the radio frequency signals from the coil units that is obtained in the prior art is replaced with the sum of products of modulus values of radio frequency signals from the coil units at the symmetrical positions. This effectively reduces the influence on the difference of signal strengths acquired by the coil units at close distances and at farther distances, thereby reducing the differences of signal strengths and signal to noise ratios in an imaging area of the lateral cross-sectional image, and making the signal strengths and signal to noise ratios in the imaging area of lateral cross-sectional images more uniform than that in the prior art, thus realizing the object of improving the signal strengths and the uniformity of signal to noise ratios in the imaging area. In addition, the present invention also reduces the influence on the difference of signal strengths acquired by the coil units at a close distance and at a farther distance by summing modulus values of the N channels of coil output signals and generating the sagittal plane image and/or coronal plane image according to the summed result, thereby improving the signal strength and the uniformity of signal to noise ratio within the imaging areas in the sagittal plane and coronal plane.

BRIEF DESCRIPTION OF THE DRAWINGS

FIG. 9 shows a construction schematic diagram of a preferred tubular surface coil of the present invention.

FIG. 10 shows a schematic structural diagram of a system for processing radio frequency signals in the embodiments of the present invention.

DESCRIPTION OF THE PREFERRED EMBODIMENTS

The basic concept of the present invention is that during the processing of the radio frequency signals of a tubular surface coil, the corresponding processing is performed on multiple channels of coil output signals of the tubular surface coil, so as to reduce the influence on the differences of signal strengths acquired by the coil units at a close distance and a farther distance, thereby improving the signal strengths and the uniformity of signal to noise ratio in the imaging area of the lateral cross-sectional image.

The tubular surface coil suitable for the present invention have M coil units (M is an even number greater than 1), and each coil unit acquires one channel of radio frequency signals. The M coil units in the tubular surface coil can be divided into M/2 pairs, and the two coil units in each pair of coil units are located at symmetrical positions in the tubular surface coil. This means, it is necessary to divide the M coil units in the tubular surface coil into M/2 pairs, with two coil units in each pair of coil units being disposed at the symmetrical positions in the tubular surface coil. It should be noted that, due to the difference in manufacturing process and particular cases in use, this symmetry is not absolute, and a certain difference is permissible, as long as it will not influence the effects of the present invention.

Figure 5:
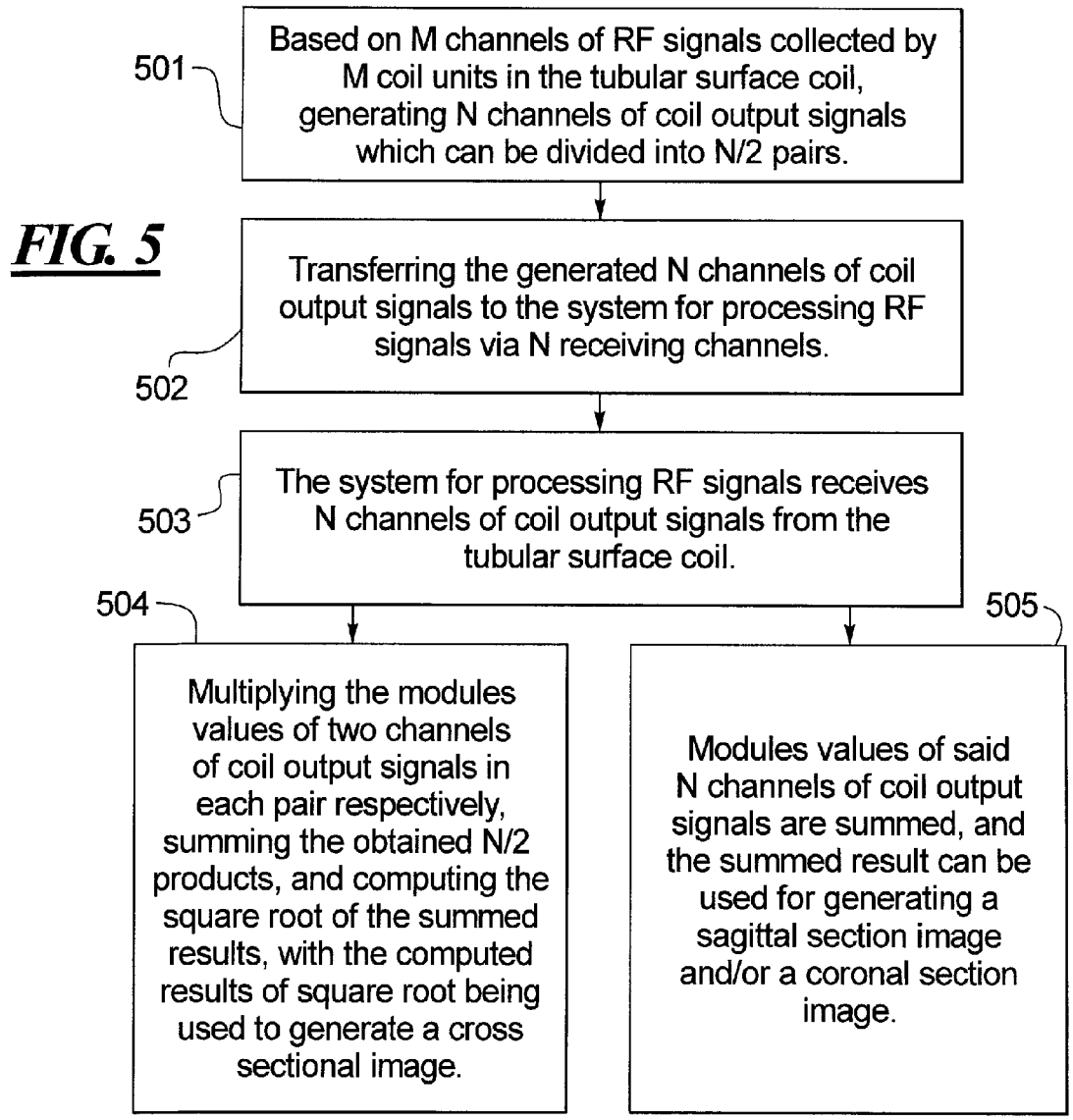
FIG. 5 is a flowchart of a method for processing radio frequency signals of the present invention.

FIG. 5 is a flowchart of the method for processing radio frequency signals of the present invention. Referring to FIG. 5, the method includes the steps of:

Step 501: generating N channels of coil output signals based on M channels of radio frequency signals acquired by M coil units in the tubular surface coil (N is an even number greater than 1 and less than or equal to M), such that the generated N channels of coil output signals can be divided into N/2 pairs, with two channels of coil output signals in each pair respectively coming from the coil units located at the symmetrical positions in the tubular surface coil.

Figure 1:
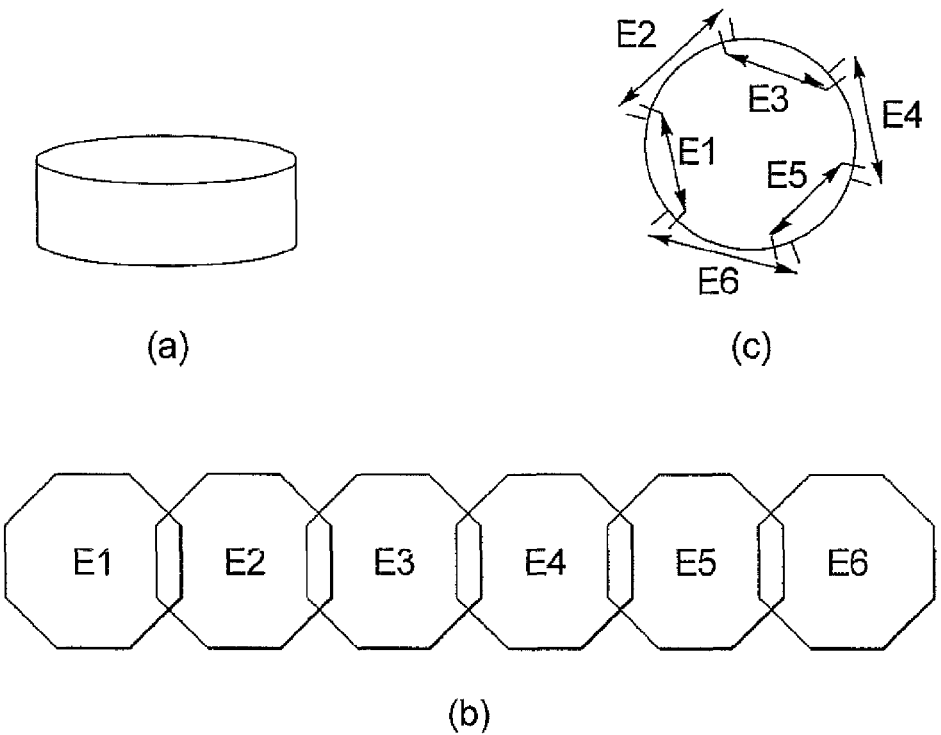
FIG. 1 shows a construction schematic diagram of a known knee coil.
Figure 2:
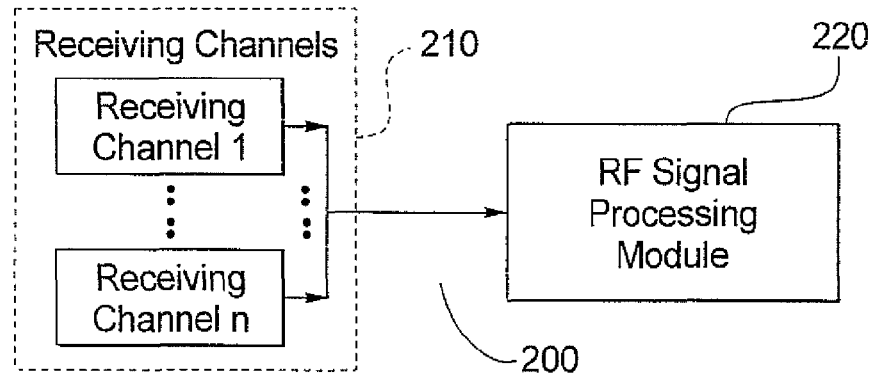
FIG. 2 shows a construction schematic diagram of an existing system for processing radio frequency signals.

In conjunction with the knee coil shown in FIG. 1, E1 and E4 are the coil units located at the symmetrical positions in the tubular surface coil in the embodiment of the present invention, likewise, E2 and E5, E3 and E6 are respectively two pairs of the coil units located at symmetrical positions in the tubular surface coil in the embodiment of the present invention.

Step 502: transmitting respectively the generated N channels of coil output signals from the tubular surface coil via N receiving channels to the system for processing radio frequency signals, wherein each receiving channel transmits one channel of coil output signals.

Step 503: receiving by the system for processing radio frequency signals the N channels of coil output signals coming from the tubular surface coil.

Step 504: firstly, multiplying modulus values of two channels of coil output signals in each pair of coil output signals of step 501, respectively, to obtain N/2 products. In other words, the multiplied two channels of coil output signals respectively come from the coil units located at the symmetrical positions in the canister surfaced coil. Subsequently, summing the obtained N/2 products, and computing the square root of the summed result. The computed result of square root can further be sent to an image reconstruction system to generate lateral cross-sectional images. The process for generating lateral cross-sectional images according to the computed result of square root is similar to the process for generating lateral cross-sectional images according to square (S012+S022+ . . . +S062) in the prior art, that is, using the computed result of square root to perform the subsequent processing of image reconstruction, so as to generate corresponding images.

In the method shown in FIG. 5, step 503 can be followed by step 505: summing modulus values of said N channels of coil output signals. The summed result can be further sent to the image reconstruction system, for generating sagittal plane images and/or coronal plane images. The process for generating sagittal plane images and/or coronal plane images according to the summed result is similar to the process for generating sagittal plane images and/or coronal plane images according to square (S012+S022+ . . . +S062) in the prior art, that is, using the summed result to perform the subsequent processing of image reconstruction, so as to generate corresponding images. During the processing of the radio frequency signals of the embodiments of the present invention, the priority of step 504 or step 505 is not restricted, and the priority of reconstructing lateral cross-sectional images, sagittal plane images or coronal plane images during the subsequent image reconstruction is also not restricted.

When the number N of receiving channels in the system for processing radio frequency signals is equal to the number M of coil units in the tubular surface coil, M channels of radio frequency signals acquired by the coil units can each be directly outputted as one channel of coil output signals, and therefore, in such a case, step 504 in the method for processing radio frequency signals of the present invention is as follows: computing square (S01*S04+S02*S05+S03*S06), and the computed result of square (S01*S04+S02*S05+S03*S06) can be further sent to the image reconstruction system to generate the lateral cross-sectional images, wherein, S01, S02, . . . , S06 represent the radio frequency signals coming from coil units E1, E2, E6, respectively.

When the number N of receiving channels in the system for processing radio frequency signals is equal to the number M of coil units in the tubular surface coil, step 505 in the method for processing radio frequency signals of embodiments of the present invention is as follows.

The quantity abs(S01)+abs(S02)+abs(S03)+abs(S04)+abs(S05)+abs(S06) is calculated as a computed result that is supplied to the image reconstruction system, for generating the sagittal plane images and/or coronal plane images, wherein S01, S02, . . . , S06 represent radio frequency signals coming from coil units E1, E2, . . . , E6, respectively.

Here, "square" represents computing square root, and "abs" represents acquiring absolute value.

However, in practical applications, it is possible for the case to occur that the number N of receiving channels in the system for processing radio frequency signals is less than the number M of coil units in the tubular surface coil, and in such a case, N channels of coil output signals can be generated based on M channels of radio frequency signals acquired by coil units in the following manner.

The first step: dividing all or a part of M coil units into N groups in advance, wherein each group can have one coil unit, or more than one coil units. One extreme circumstance is that each group comprises only one coil unit. If the radio frequency signals acquired by one certain coil unit cannot be used, then this division may not involve this coil unit. The division makes the obtained N groups divided into N/2 pairs, with the two groups of coil units in each pair being located at the symmetrical positions in the tubular surface coil.

The second step: in each divided group, generating one channel of coil output signals according to the radio frequency signals acquired by the coil units in the group. For a group having only one coil unit, the radio frequency signals acquired by the one coil unit in the group are taken directly as one channel of coil output signals. For a group having more than one coil units, the radio frequency signals acquired by all the coil units in the group are synthesized as one channel of coil output signals. Due to the symmetrical relationship during their division, the N channels of coil output signals obtained finally can be divided into N/2 pairs, with the two channels of coil output signals in each pair respectively coming from coil units located at the symmetrical positions in the tubular surface coil.

In the following, description is made by taking an example, in which the number of receiving channels is 4 and the number of coil units is 6 (as the tubular surface coil shown in FIG. 1), that is: N=4, M=6.

In the first step, all six coil units can be divided into 4 groups, and the grouping relationship is: the first group is E1 and E2, the second group is E3, the third group is E4 and E5, and the forth group is E6.

In the second step, in the first group, the two channels of radio frequency signals acquired by E1 and E2 are synthesized into one channel of coil output signals (marked as S1); in the second group, radio frequency signals acquired by E3 are directly taken as one channel of coil output signals (marked as S2). In the third group, the two channels of radio frequency signals acquired by E4 and E5 are synthesized into one channel of coil output signals (marked as S3). In the forth group, radio frequency signals acquired by E6 are directly taken as one channel of coil output signals (marked as S4). The relationships between each of coil units and coil output signals can be expressed as:

$$E1, E2 \rightarrow S1$$

$$E3 \rightarrow S2$$

$$E4, E5 \rightarrow S3$$

$$E6 \rightarrow S4$$

Since E1 and E4 are coil units located at symmetrical positions in the tubular surface coil, and E2 and E5 are coil units located at symmetrical positions in the tubular surface coil, therefore S1 and S3 can be regarded as coming from coil units at the symmetrical positions in the tubular surface coil; since E3 and E6 in themselves are coil units located at symmetrical positions in the tubular surface coil, S2 and S4 also come from coil units located at symmetrical positions in the tubular surface coil. Thus, S1, S2, S3 and S4 are in accordance with the condition in the embodiments of the present invention that "N channels of coil output signals can be divided into N/2 pairs, with the two channels of coil output signals in each pair respectively coming from the coil units located at the symmetrical positions in the tubular surface coil", and S1, S2, S3 and S4 can be used to execute step 502 and subsequent steps thereof.

In addition, there is also a simplest manner in which E1 and E3, and E4 and E6 respectively located at the symmetrical positions in the tubular surface coil can be directly selected as one group, so there are four groups. Since E1 and E4 are located at symmetrical positions in the tubular surface coil, and E3 and E6 are also located at symmetrical positions in the tubular surface coil, the radio frequency signals S01, S02, S03 and S04 coming from selected E1, E3, E4 and E6 are used as four channels of emitted coil output signals which are in accordance with the condition that "N channels of coil output signals can be divided into N/2 pairs, with the two channels of coil output signals in each pair respectively coming from coil units located at symmetrical positions in the tubular surface coil". Of course, in practical use, there exist a variety of manners of generating N channels of coil output signals, which will not be described herein redundantly.

Figure 6:
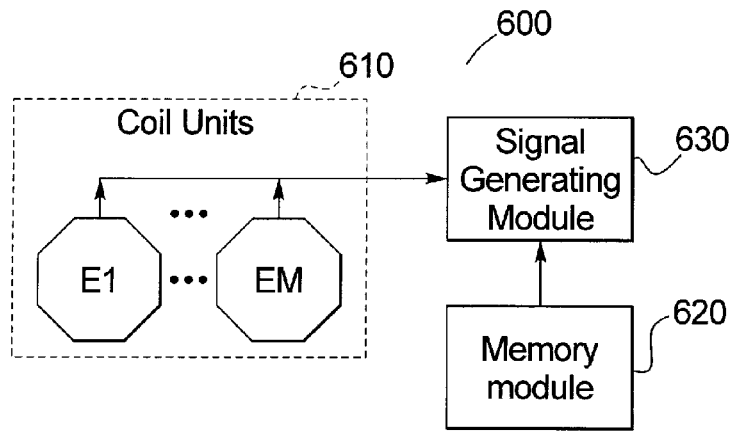
FIG. 6 is a system schematic diagram of a tubular surface coil of the present invention.

Corresponding to the above method for dividing the coil units into groups and generating one channel of coil output signals for each group of coil units, the present invention provides a tubular surface coil 600 shown in FIG. 6. Referring to FIG. 6, the tubular surface coil 600 has M coil units 610, and also comprises a memory module 620 and a signal generating module 630.

In this case, M coil units can be divided into M/2 pairs, with the two coil units in each pair of coil units being located at symmetrical positions in the tubular surface coil 600.

The memory module 620 is used for storing the number N of coil output signals and the grouping relationship when all M or a part of M coil units are divided into N groups, wherein N is an even number greater than 1 and less than or equal to M, and said N groups can be divided into N/2 pairs, with the two groups of coil units in each pair being located at symmetrical positions in the tubular surface coil 600.

The signal generating module 630 is used for, in accordance with the grouping relationship in the memory module 620, taking the radio frequency signals acquired by the coil unit in the group which comprises only one coil unit as one channel of coil output signals, and/or synthesizing the radio frequency signals acquired by all the coil units in the group that has more than one coil units into one channel of coil output signals.

Figure 3:
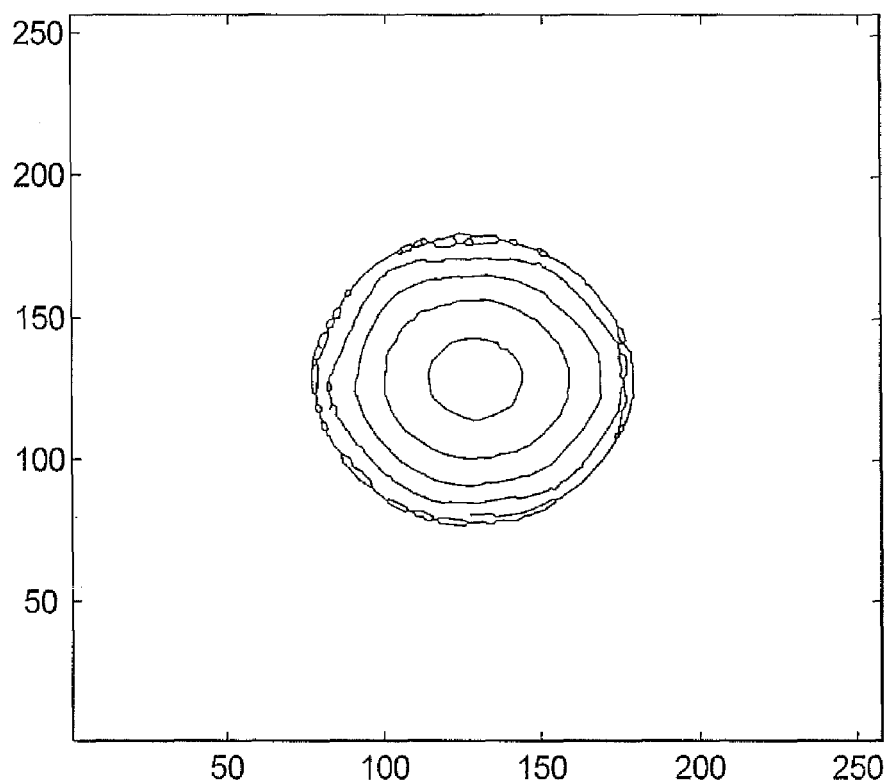
FIG. 3 is a computer screenshot showing the distribution of the signal to noise ratio of a lateral cross-sectional image of the known knee coil, wherein the horizontal coordinate and vertical coordinate are in millimeters.
Figure 4:
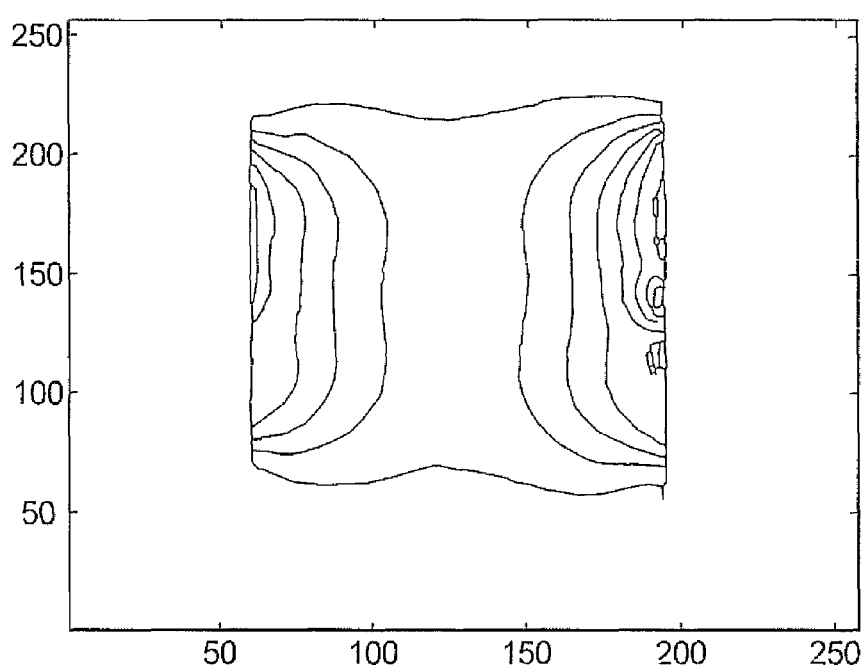
FIG. 4 is a computer screenshot showing the distribution of the signal to noise ratio of a sagittal plane image of the known knee coil, wherein the horizontal coordinate and vertical coordinate are in millimeters.
Figure 7:
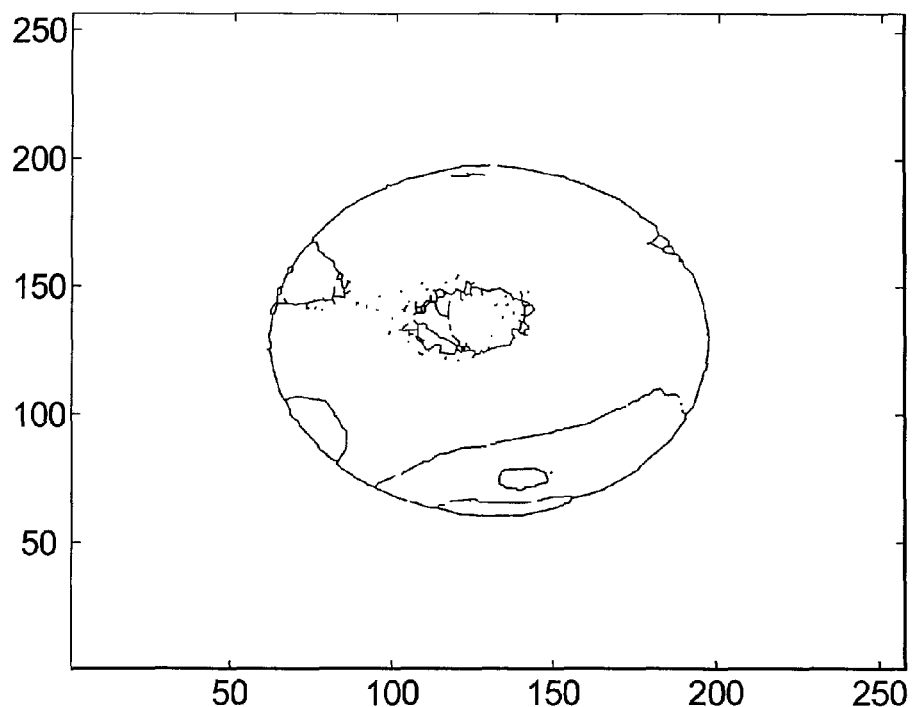
FIG. 7 is a computer screenshot showing the distribution of the signal to noise ratio of a knee lateral cross-sectional image obtained by using the technical solutions of the present invention, wherein the horizontal coordinate and vertical coordinate are in millimeters.
Figure 8:
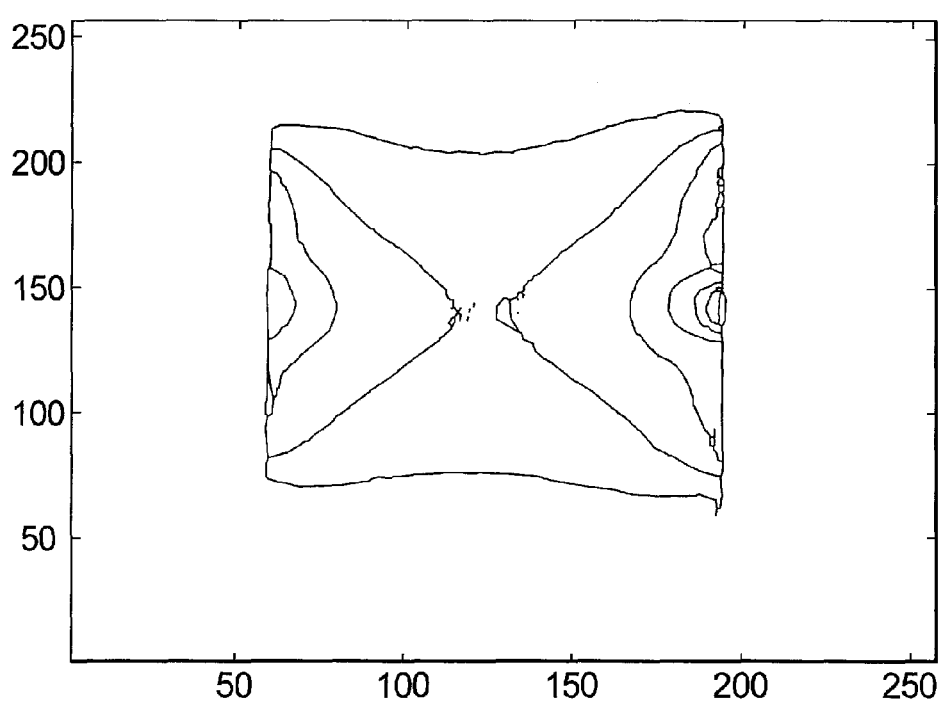
FIG. 8 is a computer screenshot showing signal to noise ratio distribution of a knee sagittal plane image obtained by using the technical solutions of the present invention, wherein the horizontal coordinate and vertical coordinate are in millimeters.

FIG. 7 is a computer screenshot showing the distribution of the signal to noise ratio of a knee lateral cross-sectional image obtained by using the technical solutions of the embodiment of the present invention; FIG. 8 is a computer screenshot showing the distribution of the signal to noise ratio of a knee sagittal plane image obtained by using the technical solutions of the embodiments of the present invention. By comparing FIG. 7 with FIG. 3, and FIG. 8 with FIG. 4, it can be seen that by using the technical solutions of the embodiments of the present invention, the uniformity of signal to noise ratio in an imaging area can be significantly improved under the condition of maintaining a relatively high signal to noise ratio.

In order to obtain relatively good effects in improving the uniformity of signal to noise ratio in the imaging area, a tubular surface coil which contains two or more than two tubular components can be constructed to perform the signal acquiring, and the method of the embodiment of the present invention can be applied to process the acquired radio frequency signals. Preferably, the two or more tubular components have a coincident axis, and these tubular components are adjacent to one another in succession in the direction of this axis, and the adjacent tubular components stagger half a coil unit in a tangential direction of the circumference in the lateral cross-section.

FIG. 9 shows a construction schematic diagram of a preferred tubular surface coil of the present invention. Referring to FIG. 9, in which:

part (a) is the appearance of the tubular surface coil, the tubular surface coil being tubular and comprising two tubular components respectively marked as upper tubular component 901 and lower tubular component 902, wherein the upper tubular component 901 and the lower tubular component 902 have a coincident axis, and the upper tubular component 901 and the lower tubular component 902 are adjacent to each other;

part (b) is an exploded schematic diagram of the tubular surface coil. The upper tubular component 901 and the lower tubular component 902 respectively comprise six coil units, and E1 to E6 belong to the upper tubular component 901, while E7 to E12 belong to the lower tubular component 902. For better decoupling, the upper tubular component 901 and the lower tubular component 902 stagger half a coil unit from each other, and this is equivalent to the state that in the part (a) of the figure, the upper tubular component 901 and the lower tubular component 902 stagger half a coil unit in the tangential direction of the circumference in the lateral cross-section; and part (c) is a diagram of positional relationship between the coil units when said twelve coil units are arranged into a tubular shape.

In the tubular surface coil shown in FIG. 9, the coil unit pairs located at symmetrical positions in the tubular surface coil are E1 and E4, E2 and E5, E3 and E6, E7 and E10, E8 and E11, and E9 and E12. If selecting at least two coil unit pairs described above, and taking one coil unit in each selected coil unit pair to include a first group of coil units, while taking the other coil unit in each selected coil unit pair to include a second group of coil units, then the first group of coil units and the second group of coil units can be regarded as being located at symmetrical positions in the tubular surface coil. For example, the first group can be E1 and E2, and the second group can be E4 and E5; or, the first group can be E3 and E9, and the second group can be E6 and E12.

Corresponding to the method for processing radio frequency signals in the tubular surface coil of the embodiments of the present invention, the present invention also provides a system for processing radio frequency signals in the tubular surface coil, and the tubular surface coil suitable for the system for processing radio frequency signals has M coil units (M is an even number greater than 1), and each coil unit acquires one channel of radio frequency signals; M coil units in the tubular surface coil can be divided into M/2 pairs, and the two coil units in each pair of coil units are located at symmetrical positions in the tubular surface coil.

As shown in FIG. 10, the system 1000 for processing radio frequency signals comprises: N receiving channels 1010, a multiplication unit 1020, a first addition unit 1030, and a square root computation unit 1040, wherein N is an even number greater than 1 and less than or equal to M.

As shown in FIG. 10, N channels of coil output signals coming from the tubular surface coil are received by N receiving channels 1010, and N channels of coil output signals can be divided into N/2 pairs, with two channels of coil output signals in each pair respectively coming from coil units located at symmetrical positions in the tubular surface coil.

The multiplication unit 1020 is used for multiplying respectively modulus values of the two channels of coil output signals in each pair of coil output signals, so as to obtain N/2 products, and providing the N/2 products to the first addition unit 1030.

The first addition unit 1030 is used for summing the N/2 products received from the multiplication unit 1020, so as to obtain a summed result, and providing the summed result to the square root computation unit 1040.

The square root computation unit 1040 is used for computing the square root of the summed result from the first addition unit 1030, and the computed result of square root can be sent further to the subsequent image reconstruction system (not shown in the figures), for generating lateral cross-sectional images.

In addition, the system 1000 for processing radio frequency signals of the present invention can further comprise a second addition unit 1050 which is used for summing modulus values of N channels of coil output signals obtained from N receiving channels, and the summed result can further be sent to the subsequent image reconstruction system (not shown in the figures), for generating the sagittal plane images and/or the coronal plane images.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for processing radio frequency (RF) signals of a tubular surface coil, wherein said tubular surface coil comprises M coil units, M being an even number greater than 1, and said M coil units are divided into M/2 pairs, with two coil units in each of the pairs being disposed at symmetrical positions in said tubular surface coil, said method comprising:

generating N channels of coil output signals based on M channels of radio frequency signals, acquired by said M coil units, wherein N is an even number which is greater than 1 and less than or equal to M, and said N channels of coil output signals are divided into N/2 pairs, with the two channels of coil output signals in each of the pairs respectively coming from the coil units at symmetrical positions in said tubular surface coil;

multiplying respectively the modulus values of the two channels of coil output signals in said each pair of coil output signals to obtain N/2 products which are then summed, and computing the square root of said summed result, with said computed result of square root being used to generate a lateral cross-sectional image.

2. The method as claimed in claim 1, comprising:
summing the modulus values of said N channels of coil output signals, and said summed result being used to generate a sagittal section image and/or a coronal section image.

3. The method as claimed in claim 1, wherein when N is equal to M, the step of generating N channels of coil output signals comprises:
taking radio frequency signals acquired by each coil unit as one channel of the coil output signals.

4. The method as claimed in claim 1, wherein when N is less than M, the step of generating N channels of coil output signals comprises:
dividing a part of said M coil units into N groups, with each group comprising one coil unit, and dividing said N groups into N/2 pairs, with two groups of coil units in each of the pairs being located at the symmetrical positions of said tubular surface coil; and
taking the radio frequency signals acquired by each of the groups of coil unit as one channel of the coil output signals.

5. The method as claimed in claim 1, wherein when N is less than M, the step of generating N channels of coil output signals comprises:
dividing all or a part of said M coil units into N groups, with each group comprising more than one coil units, and dividing said N groups into N/2 pairs, with the two groups of the coil units in each of the pairs being located at symmetrical positions of said tubular surface coil; and
synthesizing the radio frequency signals acquired by all the coil units in each of the groups into one channel of the coil output signals.

6. The method as claimed in claim 1, wherein when N is less than M, the step of generating N channels of coil output signals comprises:
dividing all or a part of said M coil units into N groups, wherein there are at least two groups which comprise one coil unit, and there are at least two groups which comprise more than one coil units; and dividing said N groups into N/2 pairs, with the two groups of the coil units in each of the pairs being located at the symmetrical positions of said tubular surface coil;
for the group comprising only one coil unit, taking radio frequency signals acquired by the coil unit in the group as one channel of the coil output signals; and
for the group comprising more than one coil units, synthesizing the radio frequency signals acquired by all the coil units in the group into one channel of the coil output signals.

7. A system for processing radio frequency signals in a tubular surface coil, wherein said tubular surface coil comprises M coil units, and M is an even number greater than 1, and said M coil units are divided to M/2 pairs, with the two coil units in each of the pair being located at symmetrical positions of said tubular surface coil, said system for processing radio frequency signals comprising:
N receiving channels, wherein N is an even number greater than 1 and less than or equal to M, and said system for processing radio frequency signals receives N channels of coil output signals from the tubular surface coil via said N receiving channels, and said N channels of the coil output signals are divided into N/2 pairs, with the two channels of coil output signals in each of the pairs respectively coming from the coil units located at the symmetrical positions of said tubular surface coil;
a multiplication unit that multiplies the modulus values of the two channels of coil output signals in each of the channel pairs of output signals respectively, to obtain N/2 products;
a first addition unit that sums said N/2 products, to obtain a summed result; and
a square root computation unit that computes the square root of said summed result, said computed result of square root being used to generate a lateral cross-sectional image.

8. The system for processing radio frequency signals as claimed in claim 7, comprising:
a second addition unit that sums the modulus values of said N channels of coil output signals, with said summed result being used to generate a sagittal section image and/or a coronal section image.

9. A tubular surface coil, comprising M coil units, wherein M is an even number greater than 1, and said M coil units are divided into M/2 pairs, with the two coil units in each of the pairs being located at symmetrical positions of said surface coil, said tubular surface coil further comprises:
a memory module that stores N coil output signals, and the grouping relationship when a part or all of said M coil units are divided into N groups, wherein N is an even number greater than 1 and less than or equal to M, and said N groups are divided into N/2 pairs, with the two groups of coil units in each of the pairs being located at the symmetrical positions of said tubular surface coil; and
a signal generating module that, according to said grouping relationship, takes radio frequency signals acquired by a group which comprises only one coil unit as one channel of the coil output signals, and/or synthesizes the radio frequency signals acquired by a group which comprises more than one coil units, into one channel of the coil output signals.

10. The tubular surface coil as claimed in claim 9, wherein said M coil units are a plurality of tubular components, and each of the tubular components comprises a plurality of coil units; and
said plurality of tubular components have a coincident axis, and are adjacent one another in succession in the direction of the axis, and the adjacent tubular components stagger half a coil unit in the tangential direction of the circumference in a lateral cross-sectional plane.

\* \* \* \* \*